(12) United States Patent
Liu et al.

(10) Patent No.: US 11,114,016 B2
(45) Date of Patent: Sep. 7, 2021

(54) PIXEL ARRANGEMENT STRUCTURE, DISPLAY PANEL AND DISPLAY APPARATUS

(71) Applicant: KunShan Go-Visionox Opto-Electronics Co., Ltd, Jiangsu (CN)

(72) Inventors: Mingxing Liu, Kunshan (CN); Xiaoyu Gao, Kunshan (CN); Pengle Dang, Kunshan (CN); Li Lin, Kunshan (CN); Shuaiyan Gan, Kunshan (CN); Feng Gao, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 0 days.

(21) Appl. No.: 17/011,212

(22) Filed: Sep. 3, 2020

(65) Prior Publication Data

US 2020/0402442 A1     Dec. 24, 2020

Related U.S. Application Data

(63) Continuation of application No. PCT/CN2019/092773, filed on Jun. 25, 2019.

(30) Foreign Application Priority Data

Dec. 13, 2018 (CN) .......................... 201811521966.4

(51) Int. Cl.
    *G09G 3/20*          (2006.01)
(52) U.S. Cl.
    CPC ... *G09G 3/2003* (2013.01); *G09G 2300/0426* (2013.01); *G09G 2300/0452* (2013.01)
(58) Field of Classification Search
    CPC ......... G09G 3/2003; G09G 2300/0426; G09G 2300/0452; H01L 27/32; G09F 9/33
    See application file for complete search history.

(56) References Cited

U.S. PATENT DOCUMENTS 6,023,315 A  *  2/2000  Harrold .................. H04N 13/31
                                                          349/108
10,043,439 B2    8/2018  Nakamura
                (Continued)

FOREIGN PATENT DOCUMENTS

CN        103311266 A      9/2013
CN        103681754 A      3/2014
                (Continued)

OTHER PUBLICATIONS

International Search Report dated Oct. 8, 2019 in corresponding International Application No. PCT/CN2019/092773; 4 pages.
                (Continued)

*Primary Examiner* — Grant Sitta
(74) *Attorney, Agent, or Firm* — Maier & Maier, PLLC

(57) ABSTRACT

Provided are a pixel arrangement structure, a display panel, and a display apparatus. The pixel arrangement structure includes a plurality of first sub-pixels, a plurality of second sub-pixels, and a plurality of third sub-pixels, and the plurality of first, second and third sub-pixels form a plurality of virtual polygons. In each virtual polygon, the second sub-pixels and the third sub-pixels are located at a first vertex and a second vertex of the virtual polygon, respectively, the first vertex and the second vertex are alternated and spaced apart from each other, the first sub-pixel is located inside the virtual polygon, a first distance from a center of the first sub-pixel to a center of any third sub-pixel is equal, a second distance from a center of the first sub-pixel to a center of any second sub-pixel is equal, and the first distance is equal to the second distance.

19 Claims, 3 Drawing Sheets

(56) References Cited

U.S. PATENT DOCUMENTS

| | | | |
|---|---|---|---|
| 2003/0151574 A1* | 8/2003 | Chang | G02F 1/136286 345/89 |
| 2006/0274090 A1* | 12/2006 | Koyama | G09G 3/3258 345/695 |
| 2014/0071030 A1* | 3/2014 | Lee | H01L 27/3218 345/82 |
| 2016/0351116 A1* | 12/2016 | Sun | G09G 3/2003 |
| 2017/0352710 A1* | 12/2017 | Hong | H01L 27/3218 |
| 2018/0088260 A1* | 3/2018 | Jin | G02F 1/136 |
| 2018/0175121 A1* | 6/2018 | Ji | H01L 51/52 |
| 2020/0343318 A1* | 10/2020 | Li | H01L 51/0011 |
| 2020/0357861 A1* | 11/2020 | Wang | H01L 27/3216 |
| 2021/0091145 A1* | 3/2021 | Huangfu | G02F 1/134345 |

FOREIGN PATENT DOCUMENTS

| | | |
|---|---|---|
| CN | 107887404 A | 4/2018 |
| CN | 108010934 A | 5/2018 |
| CN | 208077981 U | 11/2018 |
| CN | 109860237 A | 6/2019 |
| KR | 20180111733 A | 10/2018 |
| TW | 201411830 A | 3/2014 |

OTHER PUBLICATIONS

Chinese Office Action dated Dec. 5, 2019 in corresponding Chinese Application No. 201811521966.4; 12 pages.

Taiwanese Office Action dated May 14, 2020 in corresponding Taiwanese Application No. 108127608; 6 pages.

* cited by examiner

PIXEL ARRANGEMENT STRUCTURE, DISPLAY PANEL AND DISPLAY APPARATUS

CROSS-REFERENCE TO RELATED APPLICATIONS

This application is a continuation of International Application No. PCT/CN2019/092773, filed on Jun. 25, 2019, which claims the priority benefit of China Patent Application No. 201811521966.4, filed on Dec. 13, 2018. The contents of the above identified applications are incorporated herein by reference in their entireties.

TECHNICAL FIELD

The present application refers to the field of display technologies and in particular, to a pixel arrangement structure, a display panel and a display apparatus.

BACKGROUND

With wide attentions paid to high-quality picture display effects of the display apparatus, requirements for a high resolution of display apparatuses are getting higher and higher, particularly in OLED (Organic Light Emitting Diode) display apparatuses. Thus, an OLED display apparatus having a high PPI (Pixels Per Inch) is gradually coming into people's sight.

SUMMARY

In view of the aforementioned problem, embodiments of the present application provide a pixel arrangement structure, a display panel and a display apparatus.

In order to achieve the aforementioned object, the embodiments of the present application provide technical solutions as follows.

A first aspect of the embodiments of the present application provides a pixel arrangement structure, including a plurality of first sub-pixels, a plurality of second sub-pixels and a plurality of third sub-pixels, and the plurality of first sub-pixels, the plurality of second sub-pixels and the plurality of third sub-pixels constitute a plurality of virtual polygons, where in each virtual polygon, the second sub-pixel is located at a first vertex of the virtual polygon, the third sub-pixel is located at a second vertex of the virtual polygon, the first vertex and the second vertex are alternated and spaced apart, and the first sub-pixel is located inside the virtual polygon; in the virtual polygon, a first distance from a center of the first sub-pixel to a center of any third sub-pixel is equal, a second distance from a center of the first sub-pixel to a center of any second sub-pixel is equal, and the first distance is equal to the second distance.

In the pixel arrangement structure according to the embodiments of the present application, the second sub-pixel is arranged at the first vertex of the virtual polygon, the third sub-pixel is arranged at the second vertex of the virtual polygon, the first vertex and the second vertex are alternated and spaced apart, i.e., the second sub-pixel and the third sub-pixel are alternated and spaced apart, and the first sub-pixel is arranged inside the virtual polygon, and the first distance from the center of the first sub-pixel to the center of any third sub-pixel is equal, the second distance from the center of the first sub-pixel to the center of any second sub-pixel is equal, and the first distance is equal to the second distance. Thus, a sub-pixel to which the human eyes are most sensitive among three types of sub-pixels may be set as the first sub-pixel to prevent occurrence of color bias. For example, when the three types of sub-pixels are R sub-pixel (a red sub-pixel), G sub-pixel (a green sub-pixel) and B sub-pixel (a blue sub-pixel) respectively, where green light emitted by the G sub-pixel is a color to which the human eyes are most sensitive, and thus the G sub-pixel may be taken as the first sub-pixel and arranged inside a first virtual quadrangle, and distances between a center of the G sub-pixel and centers of R sub-pixels and distances between the center of the G sub-pixel and centers of B sub-pixels are both equal, thereby avoiding the color bias.

As an improvement of the pixel arrangement structure of the embodiments of the present application, the virtual polygon is defined as a first virtual quadrangle, the first virtual quadrangle has a first side and a third side that are parallel to each other, and a second side and a fourth side that are connected between the first side and the third side.

As an improvement of the pixel arrangement structure of the embodiments of the present application, a length of the first side is greater than a length of the third side, and the first virtual quadrangle is a trapezoid. Preferably, the first virtual quadrangle is non-right-angle trapezoid.

Therefore, adoption of the aforementioned pixel arrangement structure has advantages of simple arrangement, and more beneficial to prevent occurrence of color bias.

As an improvement of the pixel arrangement structure of the embodiments of the present application, lifetime of the second sub-pixel, lifetime of the first sub-pixel and lifetime of the third sub-pixel are sequentially decreased. Preferably, the first sub-pixel is a green sub-pixel, the second pixel is a red sub-pixel and the third sub-pixel is a blue sub-pixel.

The red sub-pixel, the green sub-pixel and the blue sub-pixel constitute three primary colors for color display of a display panel, which can realize the color display of the display panels.

As an improvement of the pixel arrangement structure of the embodiments of the present application, a distance between edges corresponding to the first sub-pixel and the second sub-pixel is defined as a third distance, a distance between edges corresponding to the first sub-pixel and the third sub-pixel is defined as a fourth distance, and along the second side or the fourth side, a distance between edges corresponding to the second sub-pixel and the third sub-pixel is defined as a fifth distance, and the fifth distance is greater than both the third distance and the fourth distance. Preferably, the third distance is greater than or equal to the fourth distance.

Thus, as the fourth distance is reduced, a gap in a PDL (Pixel Definition Layer) between edges corresponding to the first sub-pixel and the third sub-pixel can be reduced, and as the third distance is increased, a gap in a PDL between edges corresponding to the first sub-pixel and the second sub-pixel can be increased. Thus, an opening area of the third sub-pixel can be increased to a certain degree, and an opening area of the second sub-pixel can be reduced to a certain degree. Preferably, the opening area of the third sub-pixel, the opening area of the second sub-pixel and an opening area of the first sub-pixel are sequentially decreased. That is, the opening area of the first sub-pixel is the smallest, the opening area of the third sub-pixel is the largest, and the opening area of the second sub-pixel is in between. By taking a sub-pixel with the longest lifetime as the second sub-pixel and a sub-pixel with the shortest lifetime as the third sub-pixel in the three types of sub-pixels, lifetimes of the three types of sub-pixels can be balanced.

As an improvement of the pixel arrangement structure of the embodiments of the present application, the opening area of the third sub-pixel, the opening area of the first sub-pixel and the opening area of the second sub-pixel are sequentially decreased.

As an improvement of the pixel arrangement structure of the embodiments of the present application, the second sub-pixel and the third sub-pixel are both shaped as quadrangles, sides of the second sub-pixel are parallel to sides of the third sub-pixel corresponding to the sides of the second sub-pixel, straight lines at which the respective corresponding sides of the second sub-pixel and the third sub-pixel are located form a second virtual quadrangle, and the first sub-pixel is located at a diagonal intersection of the second virtual quadrangle. Preferably, the first sub-pixel is a quadrangle.

There is a relatively small difference between the distance between edges corresponding to the first sub-pixel and the second sub-pixel and the distance between edges corresponding to the first sub-pixel and the third sub-pixel, and the first sub-pixel is located inside the second virtual quadrangle and located at the diagonal intersection of the second virtual quadrangle. Therefore, a sub-pixel to which the human eyes are most sensitive among three types of sub-pixels may be set as the first sub-pixel to prevent occurrence of color bias.

As an improvement of the pixel arrangement structure of the embodiments of the present application, a plurality of first virtual quadrangles are arranged in a manner of sharing a side and form an array; and in the array, in the same row, two adjacent first virtual quadrangles are symmetry with respect to a shared side, and the shared side is the first side or the third side; a plurality of first virtual quadrangles in a N-th row and a plurality of first virtual quadrangles in a N+1-th row are engaged with each other; and the plurality of first virtual quadrangles in the N-th row are arranged in the same manner as a plurality of first virtual quadrangles in a N+2-th row, where N is a positive integer greater than 0.

The virtual polygon mentioned in the present application is not limited to the virtual quadrangle, and may be a virtual pentagon or other virtual polygons, as long as the purpose of the present application can be achieved.

In a direction along a line connecting centers of two second sub-pixels in the first virtual quadrangle, any two adjacent second sub-pixels are separated by a first sub-pixel; in a direction along a line connecting centers of two third sub-pixels in the first virtual quadrangle, any two adjacent third sub-pixels are also separated by a first sub-pixel; any four adjacent first sub-pixels can form a quadrangle. Therefore, in the pixel arrangement structure according to the embodiments of the present application, any one sub-pixel intersects with other two types of sub-pixels and is evenly distributed, and in terms of the entire display panel, three types of sub-pixels are evenly distributed, thereby further preventing occurrence of color bias and improving stability of color display of the display panel.

A second aspect of the embodiments of the present application provides a display panel, and the display panel includes the pixel arrangement structure according to the aforementioned technical solutions.

Advantages of the display panel are the same as that of the aforementioned pixel arrangement structure compared with the prior art, and are not repeated herein.

A third aspect of the embodiments of the present application provides a display apparatus, the display apparatus includes the display panel according to the aforementioned embodiments.

Advantages of the display apparatus are the same as that of the aforementioned display panel compared with the prior art, and are not repeated herein.

In addition to the technical problems solved, the technical features constituting the technical solutions, and the beneficial effects brought by the technical features of these technical solutions, in the above-described embodiments of the present application, other technical problems solved, other technical features included in technical solutions and the beneficial effects brought by these technical features, in the pixel arrangement structure, the display panel and the display apparatus provided in the embodiments of the present application, will be further detailed in specific implementations.

BRIEF DESCRIPTION OF DRAWING(S)

DESCRIPTION OF EMBODIMENTS

Figure 1:
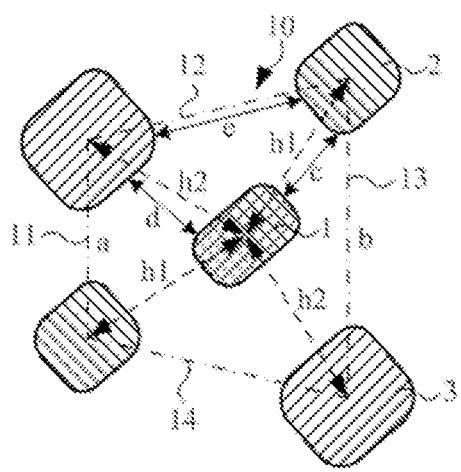
FIG. 1 is a schematic diagram of a first virtual quadrangle in a pixel arrangement structure according to an embodiment of the present application.

The technical solutions of part of embodiments of the present application are exemplarily illustrated below in combination with the accompanying drawings.

Refer to FIG. 1 to FIG. 4, an embodiment of the present application provides a pixel arrangement structure, including a plurality of first sub-pixels 1, a plurality of second sub-pixels 2 and a plurality of third sub-pixels 3, and the plurality of first sub-pixels, the plurality of second sub-pixels and the plurality of third sub-pixels constitute a plurality of virtual polygons, and in each of the plurality of virtual polygons, the second sub-pixel 2 is located at a first vertex of the virtual polygon, the third sub-pixel 3 is located at the second vertex of the virtual polygon, the first vertex and the second vertex are alternated and spaced apart (i.e., the second sub-pixel 2 and the third sub-pixel 3 are alternated and spaced apart), and the first sub-pixel 1 is located inside the virtual polygon, a first distance h2 from a center of the first sub-pixel to a center of any third sub-pixel is equal, a second distance h1 from the center of the first sub-pixel 1 to a center of any second sub-pixel 2 is equal, and the first distance h2 is equal to the second distance h1. Where the virtual polygon may be first virtual quadrangle 10.

Figure 2:
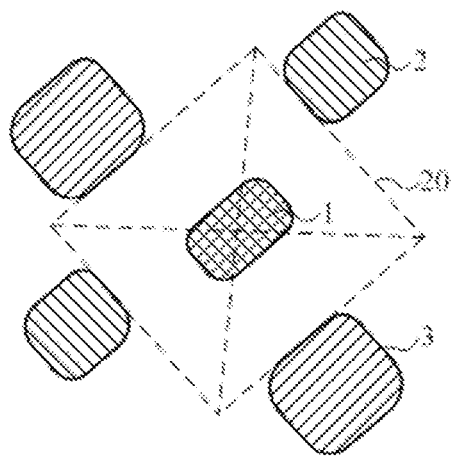
FIG. 2 is a schematic diagram of a second virtual quadrangle in a pixel arrangement structure according to an embodiment of the present application.

The pixel arrangement structure according to an embodiment of the present application includes a plurality of first sub-pixels 1, a plurality of second sub-pixels 2 and a plurality of third sub-pixels 3, and the plurality of first sub-pixels 1, the plurality of second sub-pixels 2 and the plurality of third sub-pixels 3 are arranged in arrays respectively. Refer to FIG. 1 or FIG. 2, in the pixel arrangement structure according to the embodiment of the present application, the second sub-pixels 2 and the third sub-pixels 3 are arranged surrounding one first sub-pixel 1, the second sub-pixels 2 are located at first vertexes of the first virtual quadrangle 10, the third sub-pixels 3 are located at second vertexes of the first virtual quadrangle 10, and the first vertexes and the second vertexes are alternated and spaced apart from each other, i.e., the second sub-pixels 2 and the third sub-pixels 3 are alternated and spaced apart, and the first sub-pixel is located inside the first virtual quadrangle 10.

Continue to refer to FIG. 1, in the first virtual quadrangle 10, the first distance h2 from the center of the first sub-pixel 1 to the center of any one of the third sub-pixels 3 is equal, the second distance h1 from the center of the first sub-pixel 1 to the center of any one of the second sub-pixels 2 is equal, and the first distance h2 is equal to the second distance h1. That is, in the first virtual quadrangle 10, two second sub-pixels 2 and two third sub-pixels 3 are arranged at four vertexes of the first virtual quadrangle 10 alternately and are spaced apart from each other. The first sub-pixel 1 is located inside the first virtual quadrangle 10, and a distance between a center of the first sub-pixel 1 and a center of any sub-pixel is equal.

It can be known from the foregoing embodiment that, in the pixel arrangement structure according to the embodiments of the present application, the second sub-pixels 2 are arranged at the first vertexes of the virtual polygon, the third sub-pixels 3 are arranged at the second vertexes of the virtual polygon, the first vertexes and the second vertexes are alternated and spaced apart from each other, i.e., the second sub-pixels 2 and the third sub-pixels 3 are alternated and spaced apart from each other, and the first sub-pixel 1 is arranged inside the virtual polygon, and the first distance h2 from the center of the first sub-pixel 1 to the center of any one of the third sub-pixels 3 is equal, the second distance h1 from the center of the first sub-pixel 1 to the center of any one of the second sub-pixels 2 is equal, and the first distance h2 is equal to the second distance h1. Therefore, a sub-pixel to which the human eyes are most sensitive among three types of sub-pixels may be set as the first sub-pixel 1 to prevent occurrence of color bias. For example, when the three types of sub-pixels are R sub-pixel (red sub-pixel), G sub-pixel (green sub-pixel) and B sub-pixel (blue sub-pixel) respectively, where green light emitted by the G sub-pixel is a color to which the human eyes are most sensitive, and thus, the G sub-pixel may be taken as the first sub-pixel 1 and arranged inside the first virtual quadrangle 10, and a distance between a center of the G sub-pixel and a center of the R sub-pixel and a distance between the center of the G sub-pixel and a center of the B sub-pixel are equal, thereby preventing occurrence of color bias.

The pixel arrangement structure according to the embodiments of the present application may be applied to a display panel, a display apparatus having the display panel may be applied to different products, such as cellphones, tablet PCs, e-books and other products, which are not listed here one by one.

Continue to refer to FIG. 1, in an embodiment of the present application, the virtual polygon is a quadrangle. It can be understood that the virtual polygon is the first virtual quadrangle 10, the first virtual quadrangle 10 has first side 11 and third side 13 that are parallel to each other, and has second side 12 and fourth side 14 that are connected between the first side 11 and the third side 13. Specifically, continue to refer to FIG. 1, in the embodiment of the present application, the virtual polygon is a quadrangle, i.e., the virtual polygon is the first virtual quadrangle 10, the first virtual quadrangle 10 has four vertexes, which respectively are two first vertexes that are opposite to each other and two second vertexes that are opposite to each other, two second sub-pixels 2 are located at the two first vertexes respectively, and two third sub-pixels 3 are located at the two second vertexes respectively. That is, the two second sub-pixels 2 are opposite to each other in the first virtual quadrangle 10, and the two third sub-pixels 3 are opposite to each other in the first virtual quadrangle 10, and a center of the two second sub-pixels 2 is positioned on one diagonal line of the first virtual quadrangle 10, and a center of the two third sub-pixels 3 is positioned on the other diagonal line of the first virtual quadrangle 10.

In an embodiment, the first virtual quadrangle 10 has the first side 11 and the second side 13 that are parallel to each other, and a length a of the first side 11 and a length b of the second side 13 may be equal, and in this case the first virtual quadrangle is a rectangle; or, refer to FIG. 1, the length a of the first side 11 and the length b of the second side 13 may be different, and in this case, the second side 12 and the fourth side 14 of the first virtual quadrangle 10 are inevitably unparallel, i.e., the first virtual quadrangle 10 is not a parallelogram.

In an embodiment, the length of the first side 11 is not equal to the length of the third side 13, and in the first side 11 and the third side 13, a ratio of a shorter side to a longer side may be 0.5-0.95. For example, refer to FIG. 1, the length a of the first side 11 may be less than the length b of the third side 13, the first side 11 is the shorter side and the third side 13 is the longer side, and the ratio of the length a of the first side 11 to the length b of the third side 13 is 0.5-0.95. By designing in this manner, it is possible to prevent the first virtual quadrangle 10 from being too loose due to a too large difference in length between the first side 11 and the third side 13 being, and meanwhile prevent the space occupied by the first virtual quadrangle 10 too small due to a too small difference in length between the first side 11 and the third side 13.

Continue to refer to FIG. 1, in an embodiment of the present application, the virtual polygon is a quadrangle, i.e., the virtual polygon is the first virtual quadrangle 10, and preferably, the first virtual quadrangle 10 is a trapezoid. More preferably, the first virtual quadrangle 10 is a non-right-angle trapezoid. That is, in the first side 11 and the third side 13 that are opposite and parallel to each other in the first virtual quadrangle 10, the length a of the first side 11 is less than the length b of the third side 13, and interior angles corresponding to two ends of the third side 13 in the first virtual quadrangle 10 are all acute angles. Thus, applying the aforementioned pixel arrangement structure has advantages of simple arrangement, and more beneficial to prevent occurrence of color bias.

The pixel arrangement structure according to the embodiments of the present application may be arranged by taking lifetime of each sub-pixel into account. Specifically, in an embodiment of the present application, lifetime of the second sub-pixel 2, lifetime of the first sub-pixel 1 and lifetime of the third sub-pixel 3 are sequentially decreased under the same conditions. That is, in an actual arrangement, positions of the sub-pixels are determined according to the lifetime of the three types of sub-pixels. Specifically, a sub-pixel having the longest lifetime is arranged at the position of the second sub-pixel 2, a sub-pixel having middle lifetime is arranged at the position of the first sub-pixel 1, and a sub-pixel having the shortest lifetime is arranged at the position of the third sub-pixel 3. For example, when the three types of sub-pixels are R sub-pixel, G sub-pixel and B sub-pixel respectively, generally, the lifetime of the R sub-pixel is the longest, the lifetime of B sub-pixel is the shortest, and the lifetime of G sub-pixel is in between. Therefore, the R sub-pixel is arranged at the position of the second sub-pixel 2, the G sub-pixel is arranged at the position of the first sub-pixel 1 and the B sub-pixel is arranged at the position of the third sub-pixel 3. The R sub-pixel, the G sub-pixel and the B sub-pixel constitute three primary colors for color display of display panels, realizing the color display of the display panels.

Refer to FIG. 1, in an embodiment of the present application, a distance between edges corresponding to the first sub-pixel 1 and the second sub-pixel 2 is defined as a third distance c, a distance between edges corresponding to the first sub-pixel 1 and the third sub-pixel 3 is defined as a fourth distance d, and along the second side 12 or the fourth side 14, a distance between edges corresponding to the second sub-pixel 2 and the third sub-pixel 3 is defined as a fifth distance e. The fifth distance e is greater than the third distance c, and the fifth distance e is greater than the fourth distance d. Preferably, the third distance c is greater than the fourth distance d. Thus, reduction of the fourth distance d may reduce a gap in a pixel definition layer between edges corresponding to the first sub-pixel 1 and the third sub-pixel 3, and increase of the third distance c may increase a gap in a pixel definition layer between edges corresponding to the first sub-pixel 1 and the second sub-pixel 2, so that an opening area of the third sub-pixel 3 can be increased to a certain degree, and an opening area of the second sub-pixel 2 can be reduced to a certain degree. Preferably, the opening area of the third sub-pixel 3, the opening area of the second sub-pixel 2 and the opening area of the first sub-pixel 1 are sequentially decreased. That is, the opening area of the first sub-pixel 1 is the smallest, the opening area of the third sub-pixel 3 is the largest, and the opening area of the second sub-pixel 2 is in between. Therefore, by taking a sub-pixel with the longest lifetime as the second sub-pixel 2 and a sub-pixel with the shortest lifetime as the third sub-pixel 3 among the three types of sub-pixels, lifetimes of the three types of sub-pixels can be balanced, which can avoid occurrence of color bias during use of the display panel and improve user's experience. For example, when the three types of sub-pixels are R sub-pixel, G sub-pixel and B sub-pixel respectively, generally, the lifetime of the R sub-pixel is the longest and thus the R sub-pixel may be taken as the second sub-pixel 2, and the lifetime of the B sub-pixel is the shortest and thus the B sub-pixel may be taken as the third sub-pixel 3, so that the opening area of the R sub-pixel can be reduced to a certain degree, and the opening area of the B sub-pixel can be increased to a certain degree, to balance the lifetimes of the R sub-pixel, G sub-pixel and B sub-pixel.

Refer to FIG. 2, in an embodiment of the present application, the second sub-pixel 2 and the third sub-pixel 3 are both shaped as quadrangles, sides of the second sub-pixel 2 are parallel to sides of the third sub-pixel 3 corresponding to the sides of the second sub-pixel 2, and straight lines at which the respective corresponding sides of the second sub-pixel 2 and the third sub-pixel 3 are located form a second virtual quadrangle 20, and the first sub-pixel 1 is located at a diagonal intersection of the second virtual quadrangle 20. By designing in this manner, there is a relatively small difference between the distance between edges corresponding to the first sub-pixel 1 and the second sub-pixel 2 and the distance between edges corresponding to the first sub-pixel 1 and the third sub-pixel 3, and the first sub-pixel 1 is located inside the second virtual quadrangle 20 and located at a diagonal intersection of the second virtual quadrangle 20. Therefore, a sub-pixel to which the human eyes are most sensitive among three types of sub-pixels may be set as the first sub-pixel 1 to prevent occurrence of color bias. For example, when the three types of sub-pixels are R sub-pixel, G sub-pixel and B sub-pixel respectively, where green light emitted by the G sub-pixel is a color to which the human eyes are most sensitive, and thus the G sub-pixel may be taken as the first sub-pixel 1 and arranged inside the first virtual quadrangle 10, and the distance between the center of the G sub-pixel and the center of the R sub-pixel and the distance between the center of the G sub-pixel and the center of the B sub-pixel are equal, which can prevent occurrence of color bias and improve brightness of an entire screen body.

Figure 3:
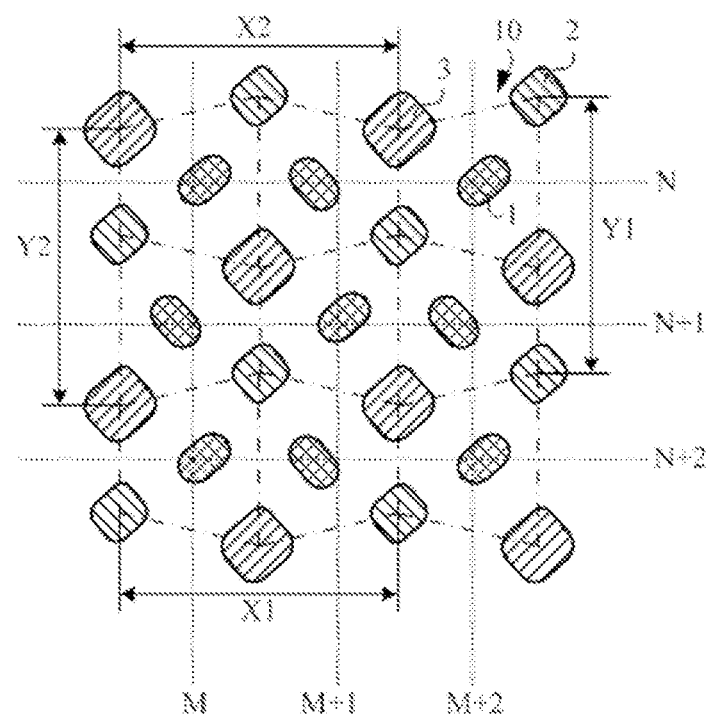
FIG. 3 is a schematic diagram of a pixel arrangement structure according to an embodiment of the present application.

In an embodiment, the first sub-pixel 1 is located at a diagonal intersection of the second virtual quadrangle 20, and the first sub-pixel 1 is preferably a quadrangle. In particular, the second virtual quadrangle 20 is preferably a square, and the first sub-pixel 1 is also a square, and the first sub-pixel 1 and the second virtual quadrangle 20 may approximately be similar quadrangles. When the pixel arrangement structure according to the aforementioned embodiments is applied to a display panel, the structure as shown in FIG. 3 may be used. The pixel arrangement structure include a plurality of the first virtual quadrangle 10, the plurality of first virtual quadrangle 10 are arranged in a manner of sharing a side, to form an array; and in the array, in the same row, two adjacent first virtual quadrangles 10 are symmetry with respect to a shared side, the shared side is the first side 11 or the third side 13; a plurality of first virtual quadrangles 10 in a N-th row and a plurality of first virtual quadrangles 10 in a N+1-th row are engaged with each other, and the plurality of first virtual quadrangles 10 in the N-th row are arranged in the same manner as a plurality of first virtual quadrangles 10 in a N+2-th row, where N is a positive integer greater than 0.

Figure 4:
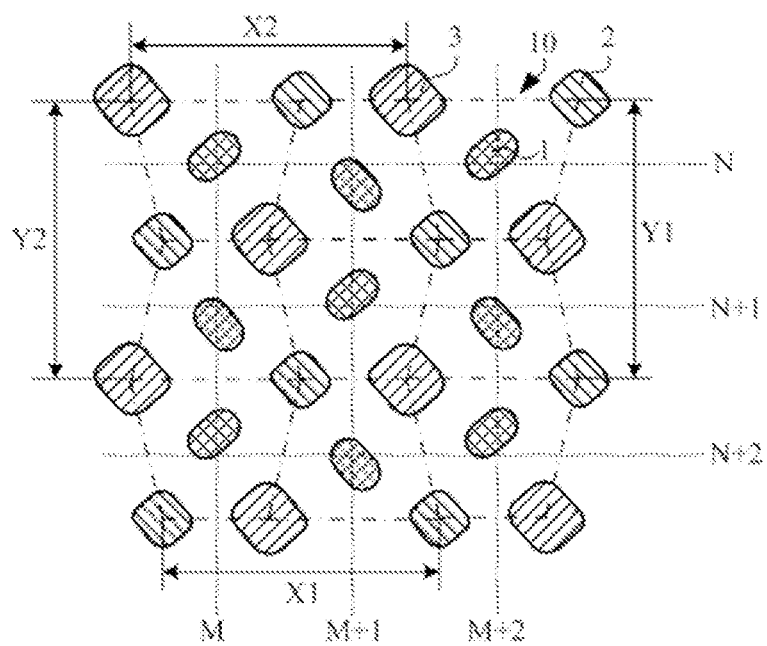
FIG. 4 is a schematic diagram of another pixel arrangement structure according to an embodiment of the present application.

Alternatively, a structure as shown in FIG. 4 may also be used, where the pixel arrangement structure includes a plurality of first virtual quadrangles 10, the plurality of first virtual quadrangles 10 are arranged in a manner of sharing a side, to form an array; and in the array, in the same column, two adjacent first virtual quadrangles 10 are symmetry with respect to a shared side, the shared side is the first side 11 or the third side 13; a plurality of first virtual quadrangles 10 in a M-th column and a plurality of first virtual quadrangles 10 in a M+1-th column are engaged with each other, and the plurality of first virtual quadrangles 10 in the M-th column are arranged in the same manner as a plurality of first virtual quadrangles 10 in a M+2-th row, where M is a positive integer greater than 0.

Further, continue to refer to FIG. 3 or FIG. 4, in the array formed by arrangement of a plurality of first virtual quadrangles 10, a distance X1 between centers of two adjacent second sub-pixels 2 along a row direction is equal to a distance Y1 between centers of two adjacent second sub-pixels 2 along a column direction and is twice a minimum unit of a single pixel; a distance X2 between centers of two adjacent third sub-pixels 3 along the row direction is equal to a distance Y2 between centers of two adjacent third sub-pixels 3 along the column direction and is twice a minimum unit of a single pixel; where the single pixel includes one first sub-pixel 1, one second sub-pixel 2 and one third sub-pixel 3.

By designing in this manner, in a direction along a line connecting centers of two second sub-pixels 2 in the first virtual quadrangle 10, any two adjacent second sub-pixels 2 are spaced by a first sub-pixel 1; in a direction along a line connecting centers of two third sub-pixels 3 in the first virtual quadrangle 10, any two adjacent third sub-pixels 3 are also spaced by a first sub-pixel 1; any four adjacent first sub-pixels 1 surround one second sub-pixel 2 or one third sub-pixel 3. Therefore, in the pixel arrangement structure according to the embodiments of the present application, any one sub-pixel intersects with other two types of sub-pixels and is evenly distributed, and in terms of the entire display panel, three types of sub-pixels are evenly distributed, thereby further preventing occurrence of color bias, and improving stability of color display of the display panel.

In order to verify practical effects of the present application, refer to FIG. 1 to FIG. 4. The first sub-pixel 1 is G sub-pixel, the second sub-pixel 2 is R sub-pixel, and the third sub-pixel 3 is B sub-pixel. Two R sub-pixels and two B sub-pixels are arranged surrounding the G sub-pixel, and the R sub-pixel and the B sub-pixel are alternately arranged at intervals. A line connecting centers of the two R sub-pixels and centers of the two B sub-pixels, which surrounds the G sub-pixel, forms a first virtual quadrangle 10, and the first virtual quadrangle 10 is a trapezoid. Preferably, the first virtual quadrangle 10 is a non-right-angle trapezoid. The G sub-pixel is located inside the first virtual quadrangle 10, and the first distance h2 from the center of the G sub-pixel to the center of any B sub-pixel is equal, and the second distance h1 from the center of the G sub-pixel to the center of any R sub-pixel is equal, and the first distance h2 is equal to the second distance h1. The first virtual quadrangle 10 has the first side 11 and the third side 13 that are parallel to each other, and has the second side 12 and the fourth side 14 that are connected between the first side 11 and the third side 13. The length a of the first side 11 is less than the length b of the third side 13, for example, the length a of the first side 11 is 0.0532 mm, and the length b of the third side 13 is 0.0572 mm A distance between edges corresponding to the G sub-pixel and the R sub-pixel is defined as a third distance c, and a distance between edges corresponding to the G sub-pixel and the B sub-pixel is defined as a fourth distance d, and along the second side 12 or the fourth side 14, a distance between edges corresponding to the R sub-pixel and the B sub-pixel is defined as a fifth distance e, where the fifth distance e is greater than the third distance c, and the third distance c is greater than or equal to the fourth distance d. An opening area of the G sub-pixel is smaller than an opening area of the R sub-pixel, and the opening area of the R sub-pixel is smaller than an opening area of the B sub-pixel. In terms of opening ratios of the sub-pixels, for example, an opening ratio of the G sub-pixel is 5.25%, an opening ratio of the R sub-pixel is 6.91%, and an opening ratio of the B sub-pixel is 9.79%. The R sub-pixel, the B sub-pixel and the G sub-pixel are all shaped as quadrangles, and sides of the R sub-pixel are parallel to sides of the B sub-pixel corresponding to the sides of the R sub-pixel, straight lines which the sides of the R sub-pixel and the B sub-pixel are located form a second virtual quadrangle 20, and the G sub-pixel is located at a diagonal intersection of the second virtual quadrangle 20. It was verified by the aforementioned examples that applying the aforementioned pixel arrangement structure to display panels such as OLED display panel may efficiently prevent occurrence of color bias.

An embodiment of the present application also provides a display panel, the display panel includes the pixel arrangement structure according to the aforementioned embodiments.

Advantages of the display panel are the same as that of the aforementioned pixel arrangement structure compared with the prior art, and are not repeated herein.

An embodiment of the present application also provides a display apparatus, the display apparatus includes the display panel according to the aforementioned embodiment.

Advantages of the display apparatus are the same as that of the aforementioned display panel compared with the prior art, and are not repeated herein.

Each embodiment or implementation in this specification is described in a progressive manner, and each embodiment focuses on differences from other embodiments, and the various embodiments may be referred to each other for the same or similar parts.

What is claimed is:

1. A pixel arrangement structure, comprising
a plurality of first sub-pixels, a plurality of second sub-pixels and a plurality of third sub-pixels, the plurality of first sub-pixels, the plurality of second sub-pixels and the plurality of third sub-pixels form a plurality of virtual polygons, wherein, in each virtual polygon,
the virtual polygon has a first vertex and a second vertex,
the second sub-pixel is located at the first vertex of the virtual polygon,
the third sub-pixel is located at the second vertex of the virtual polygon, the first vertex and the second vertex are disposed alternately and spaced apart, the first sub-pixel is located inside the virtual polygon, and
a first distance from a center of the first sub-pixel to a center of one or more of the third sub-pixels is equal, a second distance from a center of the first sub-pixel to a center of one or more of the plurality of second sub-pixels is equal, and the first distance is equal to the second distance;
wherein the virtual polygon is defined as a first virtual quadrangle, and the first virtual quadrangle is a non-right-angle trapezoid;
wherein a plurality of first virtual quadrangles are arranged in a manner of sharing some sides to form an array; and
wherein in a direction along a line connecting centers of two second sub-pixels in the first virtual quadrangle, any two adjacent second sub-pixels are separated by one first sub-pixel; in a direction along a line connecting centers of two third sub-pixels in the first virtual quadrangle, any two adjacent third sub-pixels are also separated by one first sub-pixel; and wherein any four adjacent first sub-pixels form a quadrangle.

2. The pixel arrangement structure according to claim 1, wherein
the first virtual quadrangle has a first side and a third side parallel to each other, and a second side and a fourth side that are connected between the first side and the third side.

3. The pixel arrangement structure according to claim 2, wherein a length of the first side is greater than a length of the third side.

4. The pixel arrangement structure according to claim 2, wherein a ratio of a length of the first side to a length of the third side is 0.5-0.95.

5. The pixel arrangement structure according to claim 1, wherein lifetime of the second sub-pixel, lifetime of the first sub-pixel and lifetime of the third sub-pixel are sequentially decreased.

6. The pixel arrangement structure according to claim 5, wherein the first sub-pixel is a green sub-pixel, the second pixel is a red sub-pixel, and the third sub-pixel is a blue sub-pixel.

7. The pixel arrangement structure according to claim 6, wherein a distance between edges corresponding to the first sub-pixel and the second sub-pixel is defined as a third distance, a distance between edges corresponding to the first sub-pixel and the third sub-pixel is defined as a fourth distance, along the second side or the fourth side, a distance between edges corresponding to the second sub-pixel and the third sub-pixel is defined as a fifth distance, and the fifth distance is greater than both the third distance and the fourth distance.

8. The pixel arrangement structure according to claim 7, wherein the third distance is greater than the fourth distance.

9. The pixel arrangement structure according to claim 7, wherein an opening area of the third sub-pixel, an opening area of the second sub-pixel and an opening area of the first sub-pixel are sequentially decreased.

10. The pixel arrangement structure according to claim 2, wherein the second sub-pixel and the third sub-pixel are shaped as quadrangles, sides of the second sub-pixel are parallel to sides of the third sub-pixel corresponding to the sides of the second sub-pixel, and lines at which the sides of the second sub-pixel and the third sub-pixel respectively are located form a second virtual quadrangle, and the first sub-pixel is located at a diagonal intersection of the second virtual quadrangle.

11. The pixel arrangement structure according to claim 10, wherein the first sub-pixel is shaped as a quadrangle.

12. The pixel arrangement structure according to claim 10, wherein, in the array, in the same row, two adjacent first virtual quadrangles are symmetrical with respect to a shared side, the shared side is the first side or the third side;

a plurality of first virtual quadrangles in a N-th row and a plurality of first virtual quadrangles in a N+1-th row are engaged with each other; and the plurality of first virtual quadrangles in the N-th row are arranged in the same manner as a plurality of first virtual quadrangles in a N+2-th row, wherein N is a positive integer greater than 0.

13. The pixel arrangement structure according to claim 12, wherein in the array, a distance between centers of two adjacent second sub-pixels in a row is equal to a distance between centers of two adjacent second sub-pixels in a column and twice a dimension of a minimum unit of a single pixel, a distance between centers of two adjacent third sub-pixels in a row is equal to a distance between centers of two adjacent third sub-pixels in a column direction and twice a dimension of a minimum unit of a single pixel, and the single pixel comprises one first sub-pixel, one second sub-pixel and one third sub-pixel.

14. The pixel arrangement structure according to claim 2, wherein the first virtual quadrangle is shaped as a rectangle.

15. A pixel arrangement structure, comprising:

a plurality of first sub-pixels, a plurality of second sub-pixels, and a plurality of third sub-pixels, and the plurality of first sub-pixels, the plurality of second sub-pixels and the plurality of third sub-pixels constitute a plurality of virtual polygons, wherein each virtual polygon comprises one first sub-pixel, two or more second sub-pixels, two or more third sub-pixels, two or more first vertexes corresponding to the two or more second sub-pixels, and two or more second vertexes corresponding to the two or more third sub-pixels, the two or more first vertices and the two or more second vertices are disposed alternately and spaced apart, and the one first sub-pixel is located inside the each virtual polygon, and first distances between a center of the one first sub-pixel and centers of the two or more third sub-pixels are equal, second distances between a center of the one first sub-pixel and centers of the two or more second sub-pixel are equal, and the first distances are equal to the second distances;

wherein each virtual polygon is defined as a first virtual quadrangle, and the first virtual quadrangle is a non-right-angle trapezoid;

wherein a plurality of first virtual quadrangles are arranged in a manner of sharing some sides to form an array; and wherein in a direction along a line connecting centers of two second sub-pixels in the first virtual quadrangle, any two adjacent second sub-pixels are separated by one first sub-pixel; in a direction along a line connecting centers of two third sub-pixels in the first virtual quadrangle, any two adjacent third sub-pixels are also separated by one first sub-pixel; and wherein any four adjacent first sub-pixels form a quadrangle.

16. The pixel arrangement structure according to claim 15, wherein the virtual polygon is defined as a first virtual quadrangle, the first virtual quadrangle has a first side and a third side parallel to each other, and a second side and a fourth side that are connected between the first side and the third side, a length of the first side is different from that of the third side, and the ratio of a shorter side to a longer side of the first side and the third side is 0.5-0.95.

17. A display panel, comprising the pixel arrangement structure according to claim 1.

18. A display apparatus, comprising the display panel according to claim 17.

19. The pixel arrangement structure according to claim 1, wherein at least one second sub-pixel and at least one third sub-pixel located at a same side of the first sub-pixel along a horizontal direction are staggered along a vertical direction, and wherein the second sub-pixel and the third sub-pixel located at the same side of the first sub-pixel along the vertical direction are disposed in a line.

* * * * *